US007956931B2

United States Patent
Serizawa

(10) Patent No.: US 7,956,931 B2
(45) Date of Patent: *Jun. 7, 2011

(54) DELAY CIRCUIT AND VIDEO SIGNAL PROCESSING CIRCUIT USING THE SAME

(75) Inventor: Shunsuke Serizawa, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 1268 days.

This patent is subject to a terminal disclaimer.

(21) Appl. No.: 11/470,914

(22) Filed: Sep. 7, 2006

(65) Prior Publication Data

US 2008/0252790 A1    Oct. 16, 2008

(30) Foreign Application Priority Data

Sep. 30, 2005  (JP) ................................. 2005-286082

(51) Int. Cl.
*H04N 9/66*    (2006.01)
*H03K 5/08*    (2006.01)

(52) U.S. Cl. ........ 348/638; 348/639; 327/271; 327/277; 327/284

(58) Field of Classification Search .......... 348/518–520, 348/638, 708, 726, 727, 639, 659; 327/266–281, 327/392–401

See application file for complete search history.

(56) References Cited

U.S. PATENT DOCUMENTS

| 5,528,186 A * | 6/1996 | Imamura ....................... 327/266 |
| 5,554,949 A * | 9/1996 | Suwald .......................... 327/276 |
| 7,800,696 B2 * | 9/2010 | Serizawa et al. .............. 348/639 |

FOREIGN PATENT DOCUMENTS

JP    9-191472    7/1997

* cited by examiner

*Primary Examiner* — M. Lee
(74) *Attorney, Agent, or Firm* — Fish & Richardson P.C.

(57) ABSTRACT

A delay circuit is disclosed. A switched-capacitor group includes a plurality of switched-capacitor units, each of which have a switching element and a capacitive element charged/discharged by turning on/off the switching element. The switched-capacitor units are connected such that the input signal is input in common to all of the switched-capacitor units and the capacitive elements are charged as well such that the capacitive elements are discharged to allow the output signal to be output from the switched-capacitor units. A switching control unit performs on/off control of the switching elements to cause the capacitive elements to be charged in sequence based on the input signal, causing the capacitive element charged last time to be discharged to allow the output signal to be output in sequence from the switched-capacitor units, and performs control of all of the switching elements to be turned off upon on/off switching of the switching elements.

10 Claims, 13 Drawing Sheets

FIG. 7

|   | T0 | T1 | T2 | T3 | T4 | T5 |
|---|---|---|---|---|---|---|
| (A) VIN | D0 | D1 | D2 | D3 | D4 | |
| (B) SW1 | | ‾‾ | __ | ‾‾ | __ | |
| (C) SW2 | | ‾‾ | __ | ‾‾ | __ | |
| (D) SW3 | | __ | ‾‾ | __ | ‾‾ | |
| (E) M1 | OFF | ON | OFF | ON | | |
| (F) M2·EM3 | ON | OFF | ON | OFF | | |
| (G) M4 | OFF | ON | OFF | ON | | |
| (H) C1 | - | D1 | | D3 | | |
| (I) C2 | D0 | | D2 | | D4 | |
| (J) VOUT | - | D0 | D1 | D2 | D3 | |

FIG. 13

DELAY CIRCUIT AND VIDEO SIGNAL PROCESSING CIRCUIT USING THE SAME

CROSS-REFERENCE TO RELATED APPLICATION

This application claims the benefit of priority to Japanese Patent Application No. 2005-286082, filed Sep. 30, 2005, of which full contents are incorporated herein by reference.

BACKGROUND OF THE INVENTION

1. Field of the Invention

The present invention relates to a delay circuit and a video signal processing circuit using the delay circuit.

2. Description of the Related Art

Analog color television systems which are employed in the world are broadly divided into three systems, i.e., NTSC (National Television Standards Committee) system employed mainly in Japan and North/Central America, PAL (Phase Alternation by Line) system employed mainly in the West European countries, and SECAM (SEquential Couleur A Memoire) system employed mainly in the East European countries. The NTSC system is a system of an interlaced scanning of 30 frames/sec, each frame having 525 horizontal scanning lines, with a horizontal scanning frequency at 15.75 kHz and with a vertical scanning frequency at 60 Hz. The PAL system is a system of an interlaced scanning of 25 frames/sec, each frame having 625 horizontal scanning lines, each of which is phase-inverted. The SECAM system is a system of an interlaced scanning of 25 frames/sec, each frame having 625 horizontal scanning lines. In this manner, all the systems of the NTSC, PAL, and SECAM basically perform the interlaced scanning and, as shown in FIG. 10, transmit one screen by two separate scan of one frame for an odd-numbered field and for an even-numbered field. The one frame consists of the odd-numbered field and the even-numbered field. More specifically, in the interlaced scanning, all the scanning lines in the odd-numbered field are scanned every alternate scanning line from top to bottom of the screen. The scanning of the last scanning line in the odd-numbered field is then discontinued halfway and all the scanning lines in the even-numbered field are scanned from top to bottom as if the interstices of all the scanning lines in the odd-numbered field are filled up.

In the NTSC, PAL, and SECAM systems, video signals of R (red), G (green), and B (blue) captured as an image by a television camera are not transmitted in their original forms, but there is employed a scheme of converting the video signals captured as an image into a luminance signal Y representing brightness of the screen and a chroma signal C representing the level of shading of the screen color, and further of transmitting a composite signal SC which is obtained by compositing the luminance signal Y and the chroma signal C. FIG. 11 shows examples of waveforms of a chroma signal C, a luminance signal Y, and a composite signal SC. The chroma signal C shown in (A) of FIG. 11 is a signal obtained by converting two color-difference signals R-Y and B-Y that are obtained by subtracting the luminance signal Y from the R signal and B signal, respectively, into mutually orthogonal I•Q signal (case of NTSC system) or U•V signal (case of PAL system) and by compositing and amplitude modulating the signals. The chroma signal C includes a color burst signal BS and a carrier chrominance signal CA. Note that the color burst signal BS is a signal to be used as a reference of the phase and amplitude of the carrier chrominance signal CA, and that the carrier chrominance signal CA is a signal with a phase thereof indicative of a hue with an amplitude thereof indicative of chroma. The luminance signal Y shown in (B) of FIG. 11 includes a horizontal synchronizing signal HSYNC and a luminance signal YA. Note that the horizontal synchronizing signal HSYNC is a signal indicative of the start of a single scanning line in the horizontal direction, and that the period between the two adjacent horizontal synchronizing signals HSYNC is called "1H period (one horizontal scanning period: about 64 µsec)". The luminance signal YA is a signal indicative of the details of the luminance. The composite signal SC shown in (C) of FIG. 11 is a composite of the chroma signal C shown in (A) of FIG. 11 and the luminance signal Y shown in (B) of FIG. 11. More specifically, the composite signal SC has a waveform obtained by superimposing the color burst signal BS of the chroma signal C on the back porch of the luminance signal Y and by superimposing the carrier chrominance signal CA of the chroma signal C on the luminance signal YA.

By the way, the overseas PAL and SECAM systems require the video signal processing circuit on the receiving side to delay color-difference signals R-Y and B-Y demodulated from video signals received at the antenna by 1H period and to combine the 1H-period delayed signals with the most recent color-difference signals R-Y and B-Y, to thereby eliminate distortions arising on transmission paths and to thereby match the color-difference information of all the scanning lines by line correction. The mainstream of such a circuit for delaying by 1H period (hereinafter, referred to as a 1H-delay circuit) has hitherto been of a type using CCD (Charged Coupled Device) delay element (see, e.g., Japanese Patent Application Laid-Open Publication No. 1997-191472).

However, although the video signal processing circuit except the CCD delay element for 1H-delay circuit has hitherto been designed and manufactured exclusively by a bipolar process capable of handling analog signals easily, a shift to the next-generation BiCMOS process capable of handling both the bipolar and CMOS would enable the video signal processing circuit inclusive of the CCD delay element to be made into one chip for low-cost designing and manufacturing. It is also proposed to use as the 1H-delay circuit instead of the CCD delay element a "switched capacitor circuit" that is more inexpensive than the CCD delay element and that has hitherto been used dedicatedly as an analog filter.

FIG. 12 shows an example of a conventional configuration of the delay circuit using the switched capacitor circuit. Note that although the delay circuit shown in FIG. 12 includes two switched capacitor units for simplification of explanation, the number of the switched capacitor units may vary depending on the delay time required.

NMOS transistors M1 and M2 have their respective source electrodes that are connected in common to a capacitive element C1 to make up a single switched capacitor unit 10a. Similarly, NMOS transistors M3 and M4 have their respective source electrodes that are connected in common to a capacitive element C2 to make up a single switched capacitor unit 10b. Note that an input voltage VIN to be delayed is applied to drain electrodes of the NMOS transistors M1 and M3, while the drain electrodes of the NMOS transistors M2 and M4 are connected to a non-inverting input terminal of a voltage follower 12. A switching control circuit 11 is disposed to control on/off switching operations of the NMOS transistors M1 to M4. Note that the switching control circuit 11 inputs a switch signal SW1 to a gate electrode of the NMOS transistor M1, inputs switch signals SW2 to gate electrodes of the NMOS transistors M2 and M3, and inputs a switch signal SW3 to a gate electrode of the NMOS transistor M4. Such a configuration allows the voltage follower 12 to output an output voltage VOUT that is delayed from the input voltage VIN by a period of switching cycle of the NMOS transistors M1 to M4.

FIG. 13 is timing chart showing operation examples of the delay circuit shown in FIG. 12. Note that the level of the input voltage VIN is assumed to shift from D0 to D4 in respective periods segmented by times T0 to T5 (see (A) of FIG. 13), and that respective periods segmented by times T0 to T5 are correlated with the period of switching cycle of the NMOS transistors M1 to M4.

First, at time T0, the switching signals SW1 to SW3 input to the gate electrodes of the NMOS transistors M1 to M4 go at low, high, and low, respectively, and keep those states till time T1 (see (B) to (D) of FIG. 13). That is, at time T0, the NMOS transistors M1 and M4 are turned off and the NMOS transistors M2 and M3 are turned on, being kept in those states till time T1 (see (E) to (G) of FIG. 13). Thus, there is formed a charging path of the NMOS transistor M3 and the capacitive element C2 in the period of time T0 to T1, with the result that electric charge corresponding to the level D0 of the input voltage VIN in such a period is charged into the capacitive element C2 via the NMOS transistor M3, to thereby cause information on the level D0 of the input voltage VIN to be held (see (I) of FIG. 13). On the other hand, there is formed a discharging path of the NMOS transistor M2 and the capacitive element C1, while any electric charge is not yet held on the capacitive element C1 (see (H) of FIG. 13) with the output voltage VOUT remaining uncertain (see (J) of FIG. 13).

Next, at time T1, the switch signals SW1 to SW3 input to the gate electrodes of the NMOS transistors M1 to M4 go at high, low, and high, respectively, and keep those states till time T2 (see (B) to (D) of FIG. 11). That is, at time T1, the NMOS transistors M1 and M4 are turned on and the NMOS transistors M2 and M3 are turned off, being kept in those states till time T2 (see (E) to (G) of FIG. 11). Thus, there is formed a charging path of the NMOS transistor M1 and the capacitive element C1 in the period of time T1 to T2, with the result that electric charge corresponding to the level D1 of the input voltage VIN in such a period is charged into the capacitive element C1 via the NMOS transistor M1, to thereby cause information on the level D1 of the input voltage VIN to be held (see (H) of FIG. 13). On the other hand, there is formed a discharging path of the NMOS transistor M4 and the capacitive element C2, with the result that electric charge held on the capacitive element C2 is discharged to thereby cause the input voltage VIN of the level D0 corresponding to the electric charge to be read out (see (I) of FIG. 13) and to be applied to the non-inverting input terminal of the voltage follower 12. This allows the voltage follower 12 to output the output voltage VOUT that is delayed from the input voltage VIN of the level D0 by the period of switching cycle of the NMOS transistors M1 to M4 (see (J) of FIG. 13). Then, afterward, the above operation is repeated in each of periods of time T2 to T3, time T3 to T4, time T4 to T5.

By the way, the switched capacitor circuit has hitherto been used exclusively as the analog filter. In the case of the analog filter use, employed as a cut-off frequency that is one of the filter characteristics is a much lower frequency than the frequency of the operation clock (switching signal) of the switched capacitor circuit for use in the delay circuit as shown in FIG. 12. For example, when the switched capacitor circuit is used to delay 1H period the color-difference signals R-Y and B-Y in the field of video signal processing, the frequency is of the order of several megahertz (MHz), whereas in the case of the analog filter use, the frequency is mainly of the order of several hundred hertz (Hz) to several kilohertz (kHz).

Accordingly, the following problems may occur in the case of using the switched capacitor circuit as the delay circuit.

Describing based on the delay circuit of FIG. 12, rise and fall of the output voltage responding to the input voltage undergo effects of difference of slew rate depending on the difference in the input/output voltage characteristics of the NMOS transistors M1 to M4 in the switched capacitor units 10a and 10b. The NMOS transistors M1 to M4 have their respective thresholds of input voltage defined as branch points of whether the logical levels of the respective output voltages become at high or low. The slew rate and the threshold of the input voltage may have their respective manufacturing dispersions for each of the NMOS transistors M1 to M4 and further may vary depending on the ambient temperatures or loads.

Thus, irrespective of the switching signals SW1 to SW3 input from the switching control circuit 11 to the gate electrodes of the NMOS transistors M1 to M4 to turn on/off the NMOS transistors M1 to M4 at the same time (see (A) to (C) of FIG. 14), the respective input/output rise and fall periods of the NMOS transistors M1 to M4 may have non-negligible lengths as compared with one cycle of the operation clock in the delay circuit use and may also have dispersions, resulting in the states where all the NMOS transistors M1 to M4 are turned on (the hatched portions of (D) to (F) of FIG. 14).

Although originally the NMOS transistors M1 and M4 are to switch from off to on and the NMOS transistors M2 and M3 are to switch from on to off instantly at time T1 shown in (A) to (J) of FIG. 13, any period may occur in which all the NMOS transistors are turned on as shown in (A) to (F) of FIG. 14. In this case, though the NMOS transistor M3 should originally be turned off at time T1 to cut off the charging path to the capacitive element C2 so that electric charges held on the capacitive element C2 in the preceding period of T0 to T1 are preserved, there will be formed a charging path of the NMOS transistor M3 and the capacitive element C2. As a result, electric charges corresponding to the level D1 of the input voltage VIN are charged not only into the capacitive element C1 via the NMOS transistor M1 but also into the capacitive element C2 via the NMOS transistor M3. This may also result in formation of an abnormal closed loop extending from the capacitive element C1 through the NMOS transistors M2 and M4 to the capacitive element C2.

In this manner, when using the switched capacitor circuit as the delay circuit, such a case may possibly occur that all the switching elements of the switched capacitor circuit are turned on at the same time, whereupon the switched capacitor circuit may not effect its normal operations expected as the 1H-delay circuit.

SUMMARY OF THE INVENTION

In order to solve the above problems, according to a main aspect of the present invention there is provided a delay circuit acquiring an output signal delayed from an input signal, comprising: a switched capacitor group that includes a plurality of switched capacitor units, wherein each of the plurality of switched capacitor units has a switching element, and a capacitive element which is charged/discharged by turning on/off the switching element, and wherein the plurality of switched capacitor units are connected such that the input signal is input in common to all of the plurality of switched capacitor units and such that the capacitive elements are charged as well as such that the capacitive elements are discharged to allow the output signal to be output from each of the plurality of switched capacitor units; and a switching control unit that performs on/off control of each of the switching elements of the plurality of switched capacitor units, to cause each of the capacitive elements of the plurality of switched capacitor units to be charged in sequence based on the input signal, and that, upon causing the each of the capacitive elements to be charged in sequence based on the input signal, causes the capacitive element charged last time to be discharged, to allow the output signal to be output in sequence from each of the plurality of switched capacitor units, and that, upon on/off switching of each of the switching elements of the plurality of switched capacitor units, performs control of all of the switching elements of the plurality of switched capacitor units so as to be turned off.

The present invention enables provisions of a delay circuit utilizing switched capacitors capable of proper delay processing, and a video signal processing circuit using the same.

BRIEF DESCRIPTION OF THE DRAWINGS

For more thorough understanding of the present invention and advantages thereof, the following description should be referenced in conjunction with the accompanying drawings, in which:

Figure 7:
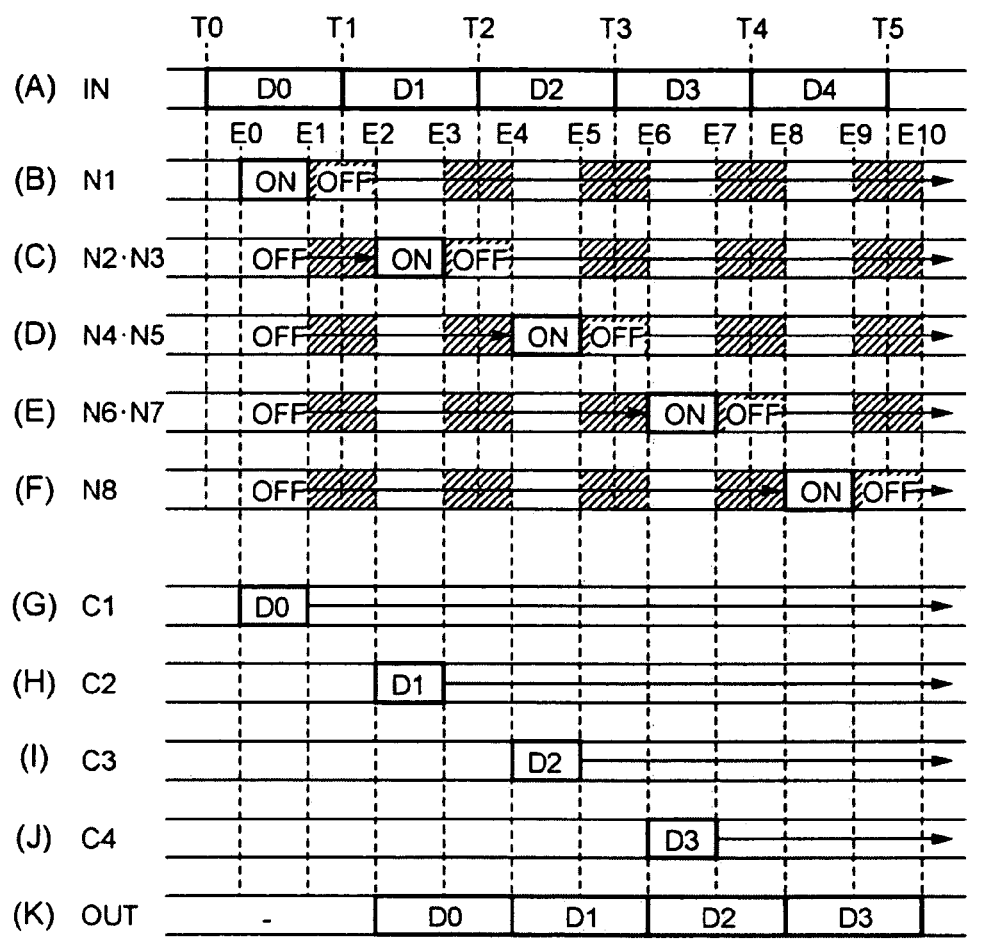

FIG. 7 shows operation timing of major signals in the 1-H delay circuit according to one embodiment of the present invention;

FIG. 13 shows conventional timing of operation of main signals in the delay circuit using the switched capacitor circuit.

DETAILED DESCRIPTION. OF THE INVENTION

At least the following details will become apparent from the descriptions of this specification and of the accompanying drawings.

<Configuration of Television Receiving System>

Figure 1:
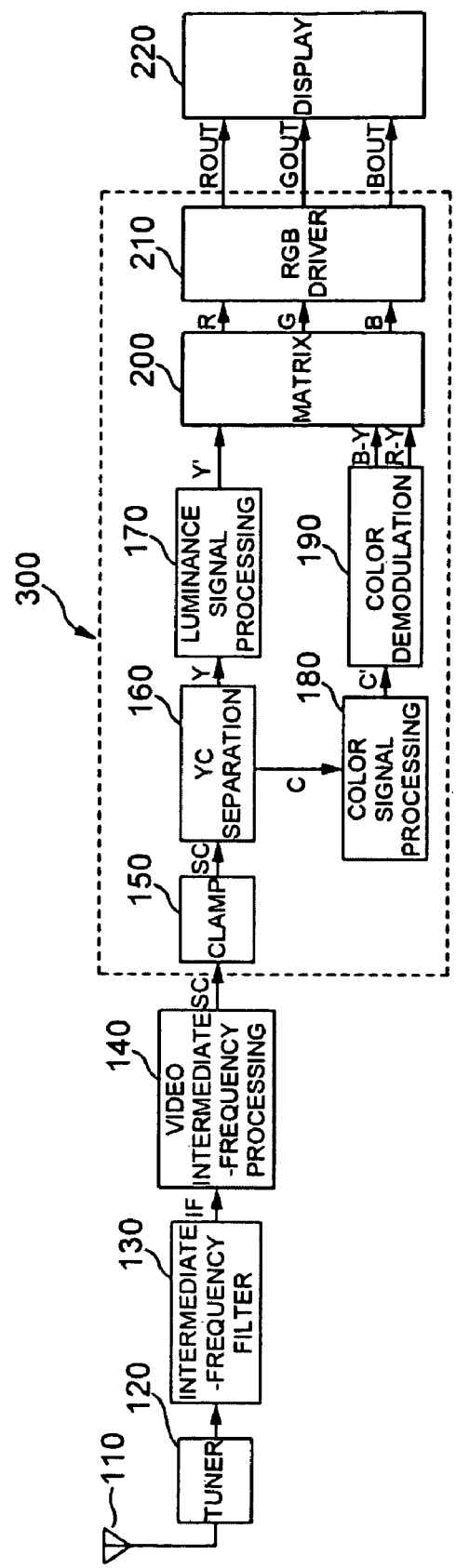
FIG. 1 shows a configuration of a television receiving system according to one embodiment of the present invention.

FIG. 1 is a configuration diagram of a television receiving system according to the present invention. A tuner 120 is a front-end processing circuit that extracts signals of a channel to be received among video signals of television broadcasting which are received at an antenna 110, and that thereafter amplifies and outputs the extracted signals. Note that the video signals of television broadcasting conform to the PAL system or the SECAM system and have three-primary-color (R, G, B) information on colors captured as an image by a television camera.

An intermediate-frequency filter 130 is a filter that extracts only intermediate-frequency signals IF from signals output from the tuner 120.

A video intermediate-frequency processing circuit 140 is a circuit that detects the intermediate-frequency signals IF extracted by the intermediate-frequency filter 130 to extract a composite signal SC.

A clamping circuit 150 is a circuit for clamping at a predetermined level the pedestal level of the composite signal SC extracted by the video intermediate-frequency processing circuit 140.

A YC separating circuit 160 is a circuit that synchronously separates the composite signal SC input from the clamping circuit 150 into a luminance signal Y and a chroma signal C.

A luminance signal processing circuit 170 is a circuit that performs contract adjustment or blanking adjustment of the luminance signal Y input from the YC separating circuit 160.

A color signal processing circuit 180 is a circuit that performs processings such as gain adjustment and color killing for each channel of the chroma signals C input from the YC separating circuit 160.

A color demodulating circuit 190 is a circuit that demodulates color-difference signals R-Y and B-Y mainly based on chroma signals C' subjected to various processings by the color signal processing circuit 180.

A matrix circuit 200 is a circuit that combines the color-difference signals R-Y and B-Y demodulated by the color demodulating circuit 190 with a luminance signal Y' subjected to various processings by the luminance signal processing circuit 170 to restore a video signal consisting of three signals, i.e., R signal, G signal, and B signal.

An RGB driver 210 is a drive circuit that generates driving signals ROUT, GOUT, and BOUT for reproducing a desired color picture on a display 220, based on three signals, i.e., R signal, G signal, and B signal input from the matrix circuit 200.

<Configuration of Video Signal Processing Circuit>

Figure 2:
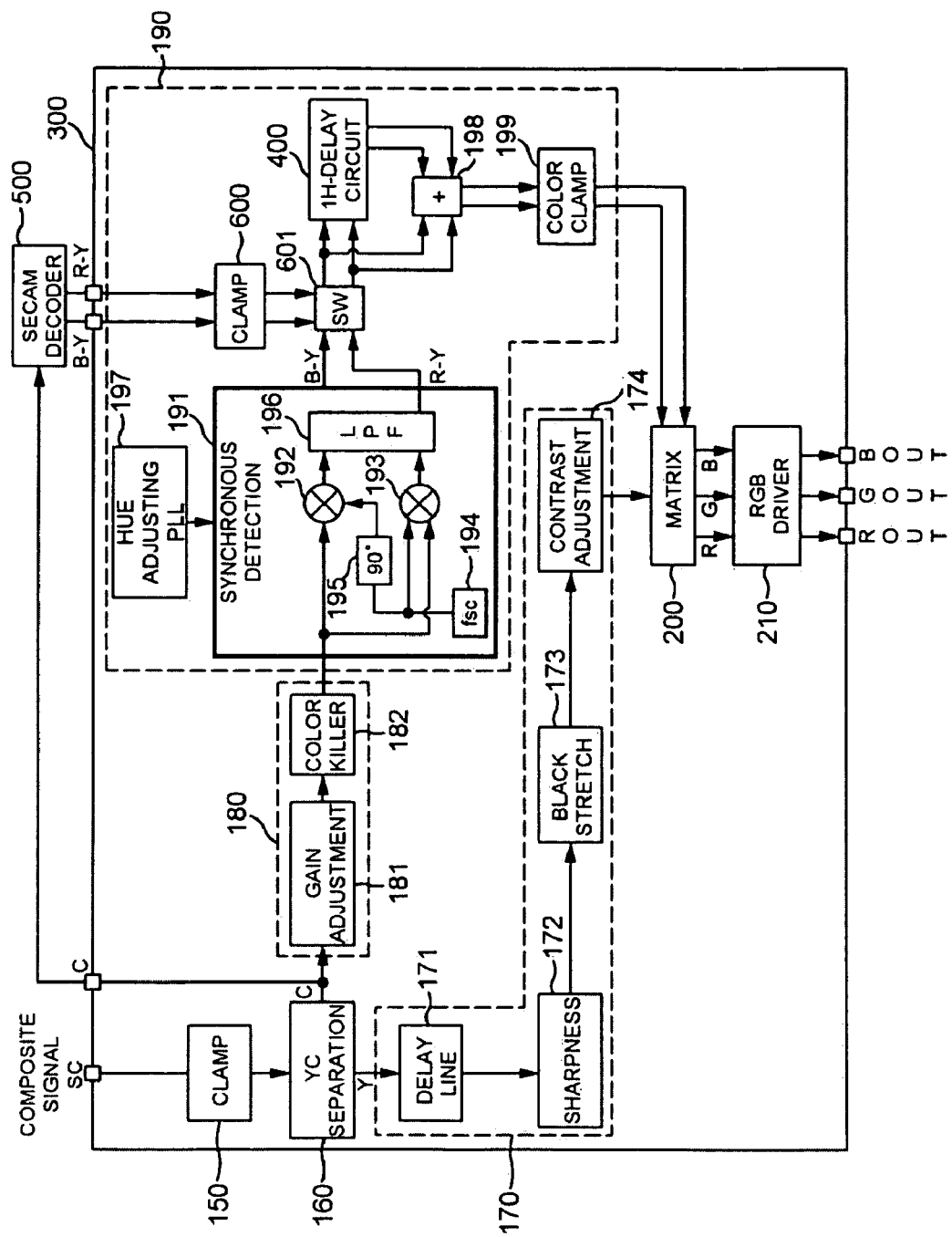
FIG. 2 shows a configuration of a video signal processing circuit according to one embodiment of the present invention.

FIG. 2 is a configuration diagram of a video signal processing circuit 300 for analog color television having a 1H-delay circuit 400 according to an embodiment of a "delay circuit" of the present invention. Note that the video signal processing circuit 300 is also capable of processing video signals under SECAM system, with externally disposed with a SECAM decoder 500, while being mainly directed to processing of video signals under PAL system. Note that the video signal processing circuit 300 may be embodied including the SECAM decoder 500 for integration. The video signal processing circuit 300 is an integrated circuit designed and manufactured by the BiCMOS process capable of handling both the bipolar and CMOS.

Although the video signal processing circuit 300 is integrated into one chip including the clamping circuit 150, the YC separating circuit 160, the luminance signal processing circuit 170, the color signal processing circuit 180, the color demodulating circuit 190, the matrix circuit 200, the RGB driver 210 as shown in FIG. 1, it may be integrated into one chip additionally including the tuner 120, the intermediate-frequency filter 130, and the video intermediate-frequency processing circuit 140.

The clamping circuit 150, the YC separating circuit 160, the matrix circuit 200, and the RGB driver 210 are the same as the above and therefore will not again be described.

The luminance signal processing circuit 170 includes a delay line 171, a sharpness adjusting unit 172, a black stretch processing unit 173, and a contrast adjusting unit 174. The delay line 171 is a circuit that delays the luminance signal Y to adjust the time difference from the demodulation processing of the chroma signal C. The sharpness adjusting unit 172 performs contour correction processing of images based on the luminance signal Y. The black stretch processing unit 173 performs processing for enhancing the resolution of dark areas of images based on the luminance signal Y to thereby prevent occurrence of a phenomenon in which black in an image gets poor. The contrast adjusting unit 174 performs processing for adjusting the difference between light and darkness of the images based on the luminance signal Y. That is, the sharpness adjusting unit 172, the black stretch processing circuit 173, and the contrast adjusting unit 174 serve as so-called effectors.

The color signal processing circuit 180 includes a gain adjusting unit 181 and a color killer circuit 182. The gain adjusting unit 181 performs processing for adjusting a chroma signal C to a proper level depending on a channel, with reference to a color burst signal SC included in the chroma signal C. The color killer circuit 182 performs processing for detecting the color burst signal SC so as not to send a carrier chrominance signal CA to the color demodulating circuit 190, by reason that noise arises when the color demodulating circuit 190 operates during the black-and-white broadcasting.

The color demodulating circuit 190 includes a synchronous detecting circuit 191, a hue adjusting PLL (Phase-Locked Loop) circuit 197, the 1H-delay circuit 400, an adder 198, a color clamping circuit 199.

Figure 3:
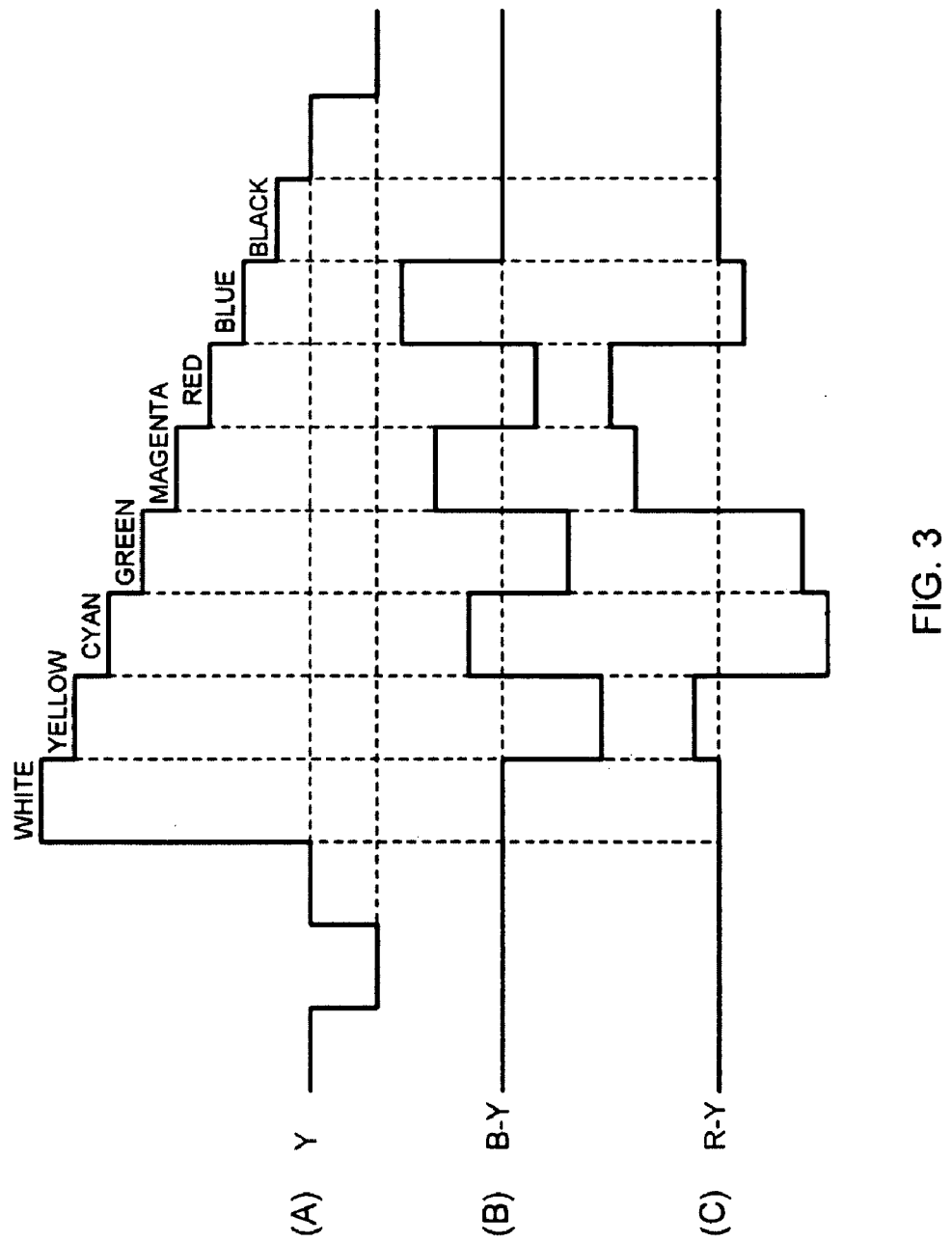
FIG. 3 shows examples of waveforms of color-difference signals B-Y and R-Y, and a waveform of a luminance signal corresponding thereto according to the present invention.

The synchronous detecting circuit 191 is directed to processing of the chroma signal C in the case of the PAL system and performs synchronous detection by multiplying a sub-carrier signal fsc generated in an oscillatory manner in a sub-carrier signal oscillator 194, by a chroma signal C' input from the color signal processing circuit 180, to output color-difference signals B-Y and R-Y at the same time. More specifically, the color-difference signal B-Y is detected and demodulated by phase-shifting the sub-carrier signal fsc by 90 degrees with the use of a phase shifter 195, then by multiplying the 90-degree phase shifted sub-carrier signal fsc by the chroma signal C' in a multiplier 192. The color-difference signal R-Y is detected and demodulated by multiplying the sub-carrier signal fsc by the chroma signal C' in a multiplier 193. Note that high-frequency components are included in the color-difference signals B-Y and R-Y detected and demodulated by the multipliers 192 and 193, respectively. For this reason, an LPF (Low Pass Filter) 196 is ordinarily removes the high-frequency components. Examples of waveforms are shown in FIG. 3 of the color-difference signals B-Y and R-Y detected and demodulated by the synchronous detecting circuit 191, and of the luminance signal Y corresponding thereto.

The hue adjusting PLL circuit 197 is a PLL circuit that adjusts the hue of the chroma signal C' by a PLL control for matching the phase of an oscillation clock signal generated by an oscillation circuit (not shown) with which a part of the PLL circuit is configured, to the phase of a color burst signal SC included in the chroma signal C.

The SECAM decoder 500 is an external circuit directed to processing of the chroma signal C in the case of the SECAM system, which inputs a chroma signal C subjected to the YC separating circuit 160, and outputs color-difference signals B-Y and R-Y detected and demodulated from the chroma signal C. The detected and demodulated color-difference signals B-Y and R-Y are then input to the video signal processing circuit 300. Note that unlike the synchronous detecting circuit 191 in the case of the PAL system, the SECAM decoder 500 outputs the color-difference signals B-Y and R-Y alternately every 1H period in conformity with the SECAM system. That is, the SECAM decoder 500 does not output the color-difference signal R-Y when outputting the color-difference signal B-Y, whereas the SECAM decoder 500 does not output the color-difference signal B-Y when outputting the color-difference signal R-Y.

A clamping circuit 600 is a circuit that clamps the color-difference signals B-Y and R-Y input from the SECAM decoder 500 at a predetermined level.

A switching circuit 601 is a circuit that selects any one of: the color-difference signals B-Y and R-Y in the case of the PAL system, which are input simultaneously from the synchronous detecting circuit 191; or the color-difference signals B-Y and R-Y in the case of the SECAM system, which are input alternately from the clamping circuit 600, in conformity with the analog color television system of the received video signals.

Figure 11:
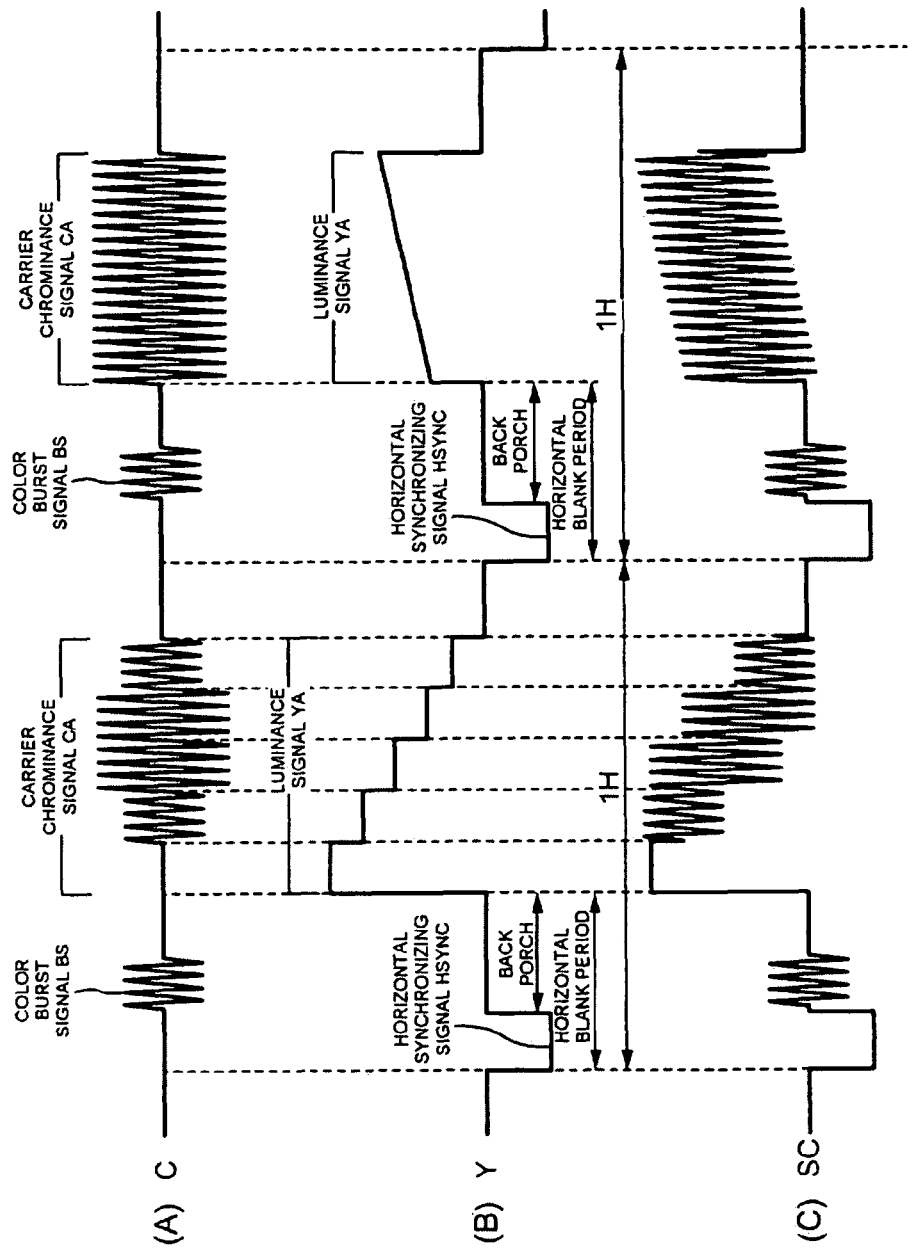
FIG. 11 shows examples of waveforms of a chroma signal C, a luminance signal Y, and a composite signal SC, respectively.
Figure 12:
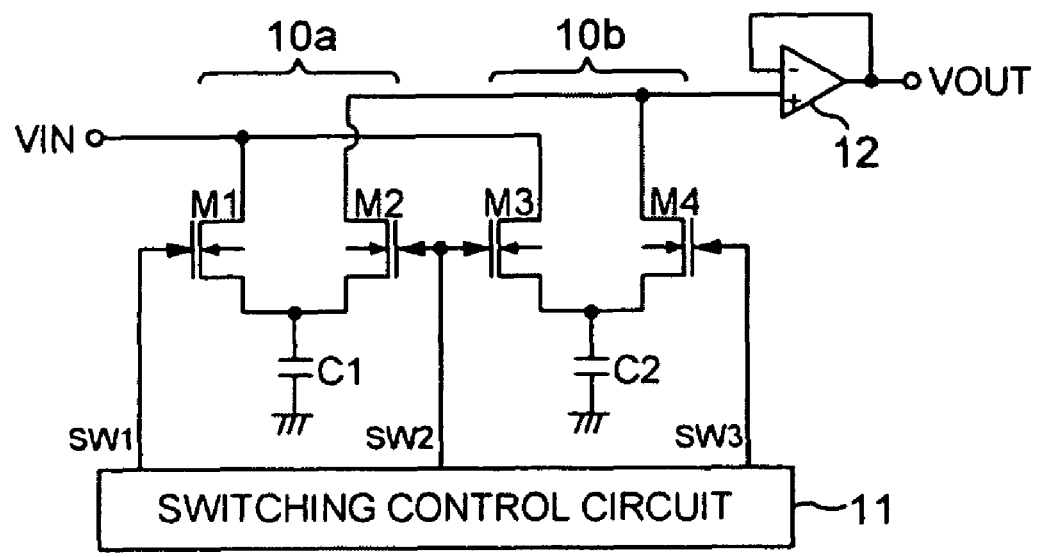
FIG. 12 is an explanatory diagram of the configuration of a delay circuit using a switched capacitor circuit.
Figure 14:
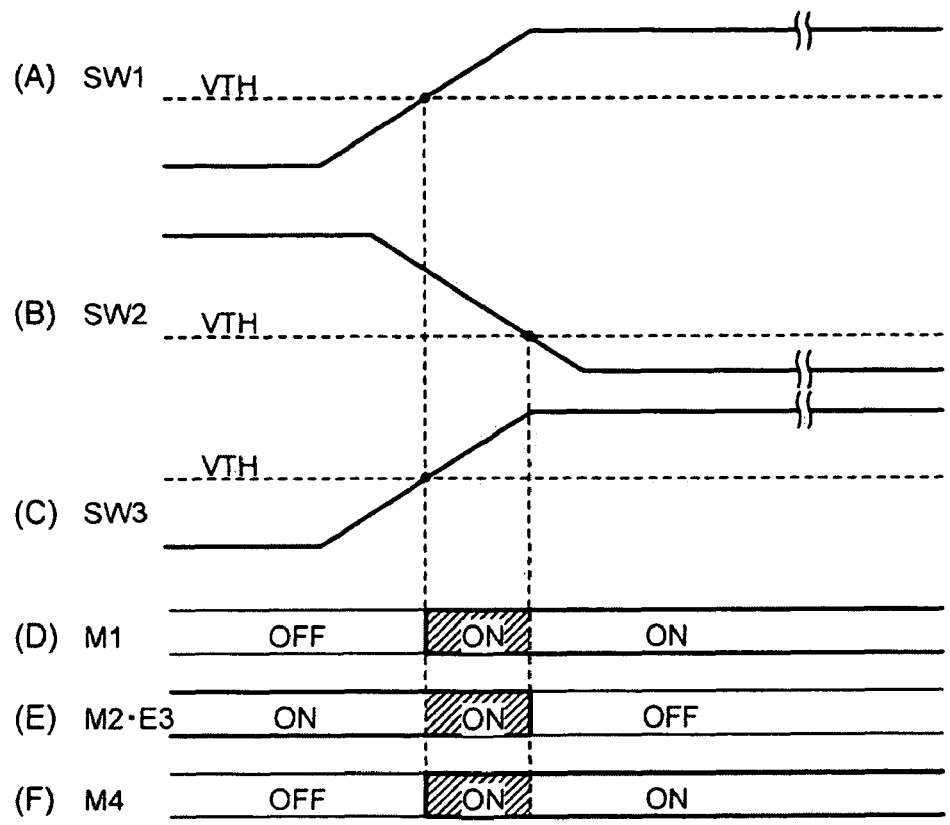
FIG. 14 is an explanatory diagram of phenomenon of the delay circuit using the switched capacitor circuit, in which all the switching elements may be turned on in certain periods.

The 1H-delay circuit 400 is a delay circuit that delays the color-difference signals B-Y and R-Y input from the switching circuit 601, by 1H period (one horizontal scanning period: about 64 μsec). Note that 1H period is a period between two adjacent horizontal synchronizing signals HSYNC as shown in FIG. 11.

The adder 198 is a circuit that adds together the color-difference signals B-Y and R-Y input from the switching circuit 601 and the color-difference signals B-Y and R-Y delayed 1H period by the 1H-delay circuit 400. This adding eliminates distortions of the chroma signals C on the transmission paths, and the line correction matches the color-difference information of all the scanning lines. Note that the result of adding of the adder 198 is clamped at a predetermined level by the color clamping circuit 199 to thereafter be input to the matrix circuit 200. As a result, the matrix circuit 200 regenerates three-primary-color (R, G, B) information on colors captured as an image by the television camera, based on the luminance signal Y' input from the luminance signal processing circuit 170 and on the color-difference signals B-Y and R-Y input from the color clamping circuit 199.

<Configuration of 1H-Delay Circuit>

Figure 4:
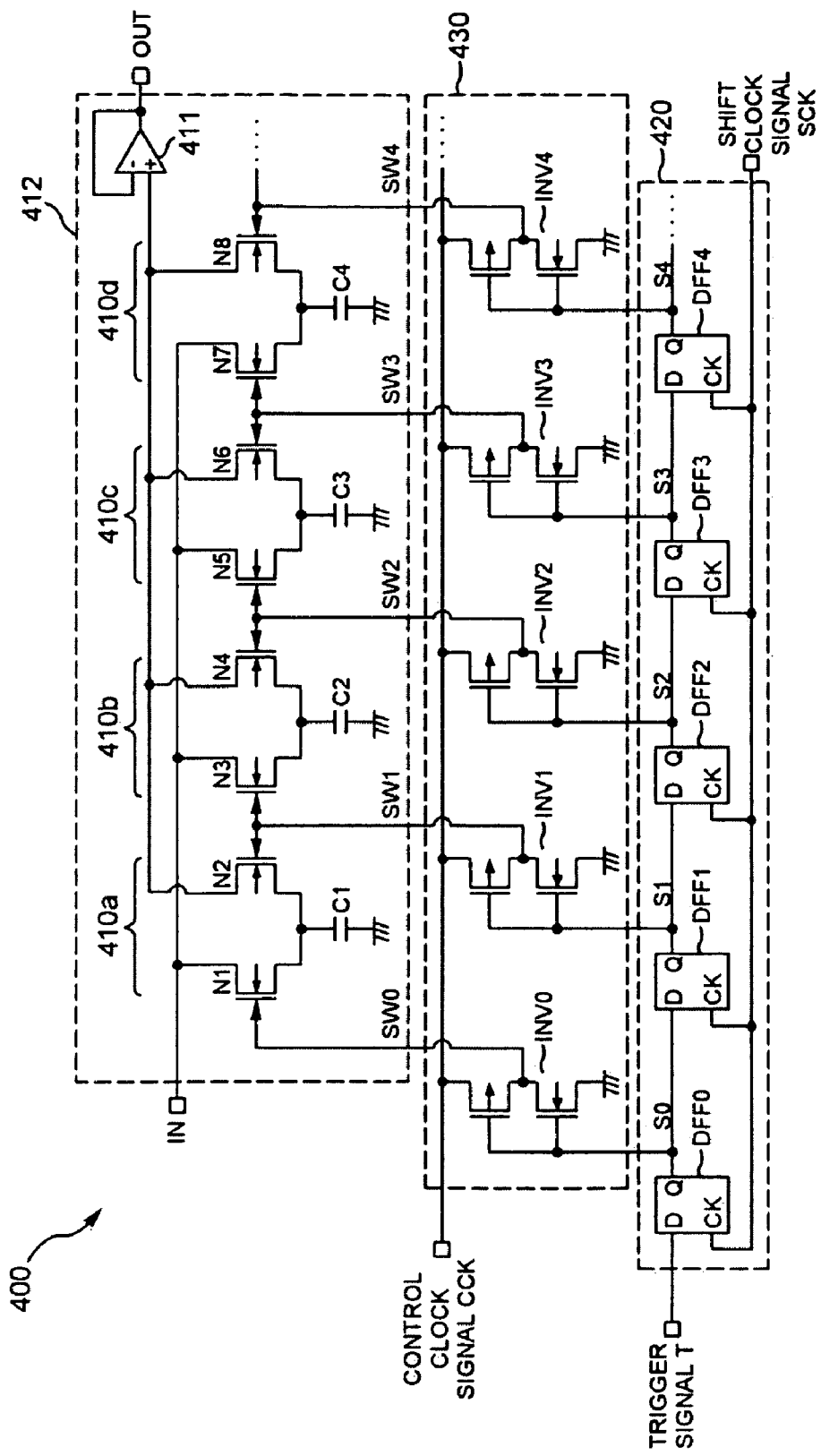
FIG. 4 shows a configuration of a 1H-delay circuit according to one embodiment of the present invention.

FIG. 4 shows an example of a circuit configuration of the 1H-delay circuit 400.

The 1H-delay circuit 400 includes a switched capacitor group 412, a shift register 420, and an on-period control unit 430. Note that the 1H-delay circuit 400 is provided for each of the color-difference signals B-Y and R-Y.

The switched capacitor group 412 includes a plurality of switched capacitor units, the number of which depends on the length of 1H period, each of the switched capacitor units having a switching element and a capacitive element which is charged/discharged by turning on/off the switching element. A plurality of the switched capacitor units are connected such that a pair of input signals IN (color-difference signals B-Y and R-Y) are input in common to all of a plurality of the switched capacitor units and such that the capacitive elements are charged as well as such that the capacitive elements are discharged to allow output signals OUT to be output from each of a plurality of the switched capacitor units, the output signals OUT (color-difference signals B-Y and R-Y) being delayed by 1H period from the input signals IN.

Note that with respect to the switched capacitor group 412 shown in FIG. 4, NMOS transistors (N1 to N8) are employed as the switching elements, and so-called buffer-type switched capacitor units (410*a* to 410*d*) are employed as the switched capacitor units. Note that the buffer-type switched capacitor units (410*a* to 410*d*) are provided by the number which depends on the length of 1H period. If 1H period is "64 μsec" and delay time of each of a pair of the buffer-type switched capacitor units (410*a* to 410*d*) is "0.25 μsec", then the number of stages of the buffer-type switched capacitor units (410*a* to 410*d*) required is "257 stages".

For example, the buffer-type switched capacitor unit 410*a* includes two NMOS transistors N1 ("one switching element" of the present invention) and N2 ("the other switching element" of the present invention), and a single capacitive element C1. Source electrodes ("one electrodes" of the present invention) of both the NMOS transistors N1 and N2 are connected in common, and to their common connection part, is the capacitive element C1 connected. An input signal is input to a drain electrode of the NMOS transistor N1 ("the other electrode of one switching element") so that the NMOS transistor N2 is turned off when the NMOS transistor N1 is turned on, to thereby allow the capacitive element C1 to properly be charged in response to the input signal IN. On the contrary, the NMOS transistor N1 is turned off when the NMOS transistor N2 is turned on so that the capacitive element C1 is properly discharged, to thereby acquire an output signal OUT from the drain electrode of the NMOS transistor N2 ("the other electrode of the other switching element" according to the present invention).

Note that similar configurations and operations apply to the buffer-type switched capacitor units 410*b* to 410*d* following the buffer-type switched capacitor unit 410*a*. That is, common connection is made among the drain electrodes of the NMOS transistors N1, N3, N5, and N7 acting respectively as charging transistors of the buffer-type switched capacitor units 410*a* to 410*d* so that the input signal IN is input in sequence to the buffer-type switched capacitor units 410*a* to 410*d*. Common connection is made among a non-inverting input terminal of a voltage follower 411 and the drain electrodes of the NMOS transistors N2, N4, N6, and N8 corresponding respectively to discharging MOS transistors of the buffer-type switched capacitor units 410*a* to 410*d*, so that the output signal OUT which is delayed from the input signal IN by 1H period is acquired in sequence from each of the buffer-type switched capacitor units 410*a* to 410*d*.

The shift register 420 and the on-period controlling unit 430 make up an embodiment of a "switching control unit" of the present invention. The shift register 420 and the on-period control unit 430 performs on/off control of each of the NMOS transistors N1 to N8 of the buffer-type switched capacitor units 410*a* to 410*d*, to cause each of the capacitive elements C1 to C4 of the buffer-type switched capacitor units 410*a* to 410*d*, respectively, to be charged in sequence based on input signals IN. Upon the sequential charge of the capacitive elements C1 to C4, any one of the capacitive elements C1 to C4 which have been charged one switching cycle before, is discharged to allow output signals OUT to be output in sequence from the buffer-type switched capacitor units 410*a* to 410*d*. Upon the on/off switching of the NMOS transistors N1 to N8 of the buffer-type switched capacitor units 410*a* to 410*d*, control is performed for temporarily turning off all of the NMOS transistors N1 to N8 of the buffer-type switched capacitor units 410*a* to 410*d*.

By turning off all of the NMOS transistors N1 to N8 in this manner, such a problem can surely be avoided that at least two of the NMOS transistors N1 to N8 may be turned on at the same time due to differences in transistor characteristics such as slew rates or threshold values of the NMOS transistors N1 to N8. This results in avoiding surely a problem that at least two of the capacitive elements C1 to C4 of the buffer-type switched capacitor units 410*a* to 410*d* may be charged at the same time. Such a problem can also surely be avoided that simultaneous turning-on of the NMOS transistors N2 and N4 for example may result in formation of an abnormal closed loop extending from the capacitive element C1 through the NMOS transistors N2 and N4 to the capacitive element C4.

Note that a scheme to turn off all of the NMOS transistors N1 to N8 as described above may include setting the delay time (1H period) of an input signal IN, by using a period of switching cycle which is a reference period for properly turning on/off each of the NMOS transistors N1 to N8; and, when delaying the input signal IN, setting an on-period to be shorter than the period of switching cycle of the NMOS transistors N1 to N8, the on-period being a period during which at least one of all the NMOS transistors N1 to N8 is turned on.

As a result, during the period of switching cycle of at least one of the NMOS transistors N1 to N8 to be on, an off-period inevitably arises in the NMOS transistors N1 to N8 to be on. During the period of switching cycle, at least one of the remaining NMOS transistors N1 to N8 to be off is naturally in off-period. Thus, there arises an off period in which all of the NMOS transistors N1 to N8 inevitably are turned off irrespective of whether they are to be on or off. Note that such a control is performed by the shift register 420 and the on-period control unit 430 which will next be detailed and is provided for at least one of the NMOS transistors N1 to N8 to be on, having advantages of less loads and enhanced effectiveness.

The shift register 420 generates parallel switching signals S0 to S4 for turning on/off the NMOS transistors N1 to N8 in sequence by sequentially shifting a one-shot pulse of a trigger signal T (a serial input signal) every time a shift clock signal SCK having the period of switching cycle of the NMOS transistors N1 to N8 set therein is entered. Note that the shift register 420 is configured with a multiplicity of DFF0 to DFF4, D-type flip-flop elements, that are connected as shown in FIG. 4.

Based on a control clock signal CCK in synchronism with the shift clock signal SCK, the on-period control unit 430 performs a control for: limiting, when any one of the parallel switching signals S0 to S4 turns to a logical level (low) for turning on at least one of all the NMOS transistors N1 to N8, the period of the logical level (low) of the any one to be shorter than the period of switching cycle of the NMOS transistors N1 to N8; and for subsequent inputting the parallel switching signals with the limited period of the logical level, to each of the gate electrodes of all the NMOS transistors N1 to N8. To this end, the on-period control unit 430 includes inverter elements INV0 to INV4 each consisting of a PMOS transistor and an NMOS transistor that are connected in series. Corresponding parallel switching signals S0 to S4 are input to the corresponding gate electrodes of the inverter elements INV0 to INV4. Parallel switching signals SW0 to SW4 obtained by inverting the logic of the parallel switching signals S0 to S4 are output from the inverter elements INV0 to INV4 and input to the gate electrodes of all the NMOS transistors N1 to N8. The control clock signal CCK is input to the power-supply side of each of the inverter elements INV0 to INV4.

The reason for disposing the inverter elements INV0 to INV4 is as follows. In this embodiments the one-shot pulse of the trigger signal T is set to be at low and the parallel switching signals S0 to S4 are signals at the level obtained by sequentially shifting the low level of the trigger signal T. The NMOS transistors N1 to N8 have characteristics to be turned on when high level is applied to the gate electrodes. In order to turn on at least one of the NMOS transistors N1 to N8 in response to the low level sequentially shifted in the parallel switching signals S0 to S4, there is a need to logic-invert the low level of the parallel switching signals S0 to S4 into high level, which necessitates the inverter elements INV0 to INV4.

The reason to input the control clock signal CCK to the power-supply side of the inverter elements INV0 to INV4 is as follows. Since power is not supplied to the inverter elements INV0 to INV4 during the period in which the control clock signal is at low, the parallel switching signals SW0 to SW4 are of high impedance. In this case, all the NMOS transistors N1 to N8 are turned on, while power is supplied to the inverter elements INV0 to INV4 during the period in which the control clock signal CCK is high, allowing the parallel switching signals SW0 to SW4 corresponding to the parallel switching signals S0 to S4 to be output. The control clock signal CCK is in synchronism with the shift clock signal SCK and thus off-period to turn off all the NMOS transistors N1 to N8 will arise in the period of switching cycle as long as the high-level-period of the control clock signal CCK is limited to be shorter than a period of one cycle of the shift clock signal SCK, i.e., the period of switching cycle of the NMOS transistors N1 to N8.

Figure 5:
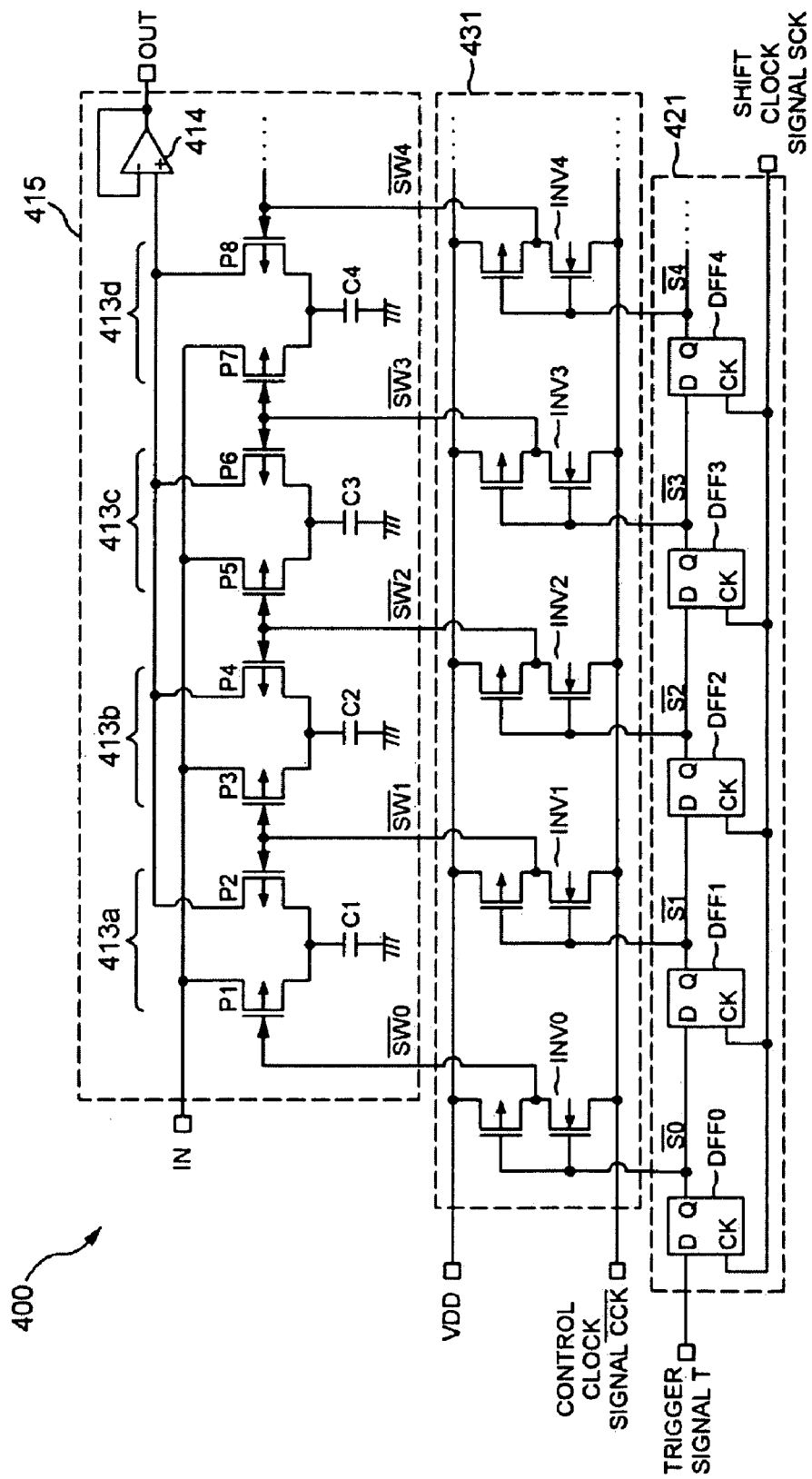
FIG. 5 shows another configuration of the 1H-delay circuit according to one embodiment of the present invention.

FIG. 5 is a configuration diagram of the 1H-delay circuit 400 in the case of employing PMOS transistors P1 to P8 as the switching elements. Similar to the 1H-delay circuit 400 of FIG. 4, it includes a switched capacitor group 415, a shift register 421, and an on-period control unit 431. The differences from the 1H-delay circuit 400 of FIG. 4 are in that as described above, the PMOS transistors are used as the switching elements of the buffer-type switched capacitor units 413a to 413d, in that accordingly the control clock signal CCK is input to the grounding side of the inverter elements INV0 to INV4 of the on-period control unit 431, and in that the control clock signal CCK input to the on-period control unit 431 and the trigger signal T input to the shift register 421 are logically inverted to each other. Such a configuration of the 1H-delay circuit 400 of FIG. 5 also ensures similar effects to those of the 1H-delay circuit 400 of FIG. 4.

<Operation of 1H-Delay Circuit>

An example of operation of the 1H-delay circuit 400 shown in FIG. 4 will be described on the basis of timing chart of FIGS. 6 and 7. The operation of the 1H-delay circuit of FIG. 5 is similar in the content to the operation of FIG. 4 except that the logic is inverted for the trigger signal T, the control clock signal CCK, the parallel switching signals S0 to S4, and the parallel switching signals SW0 to SW4, and hence will not again be described.

Figure 6:
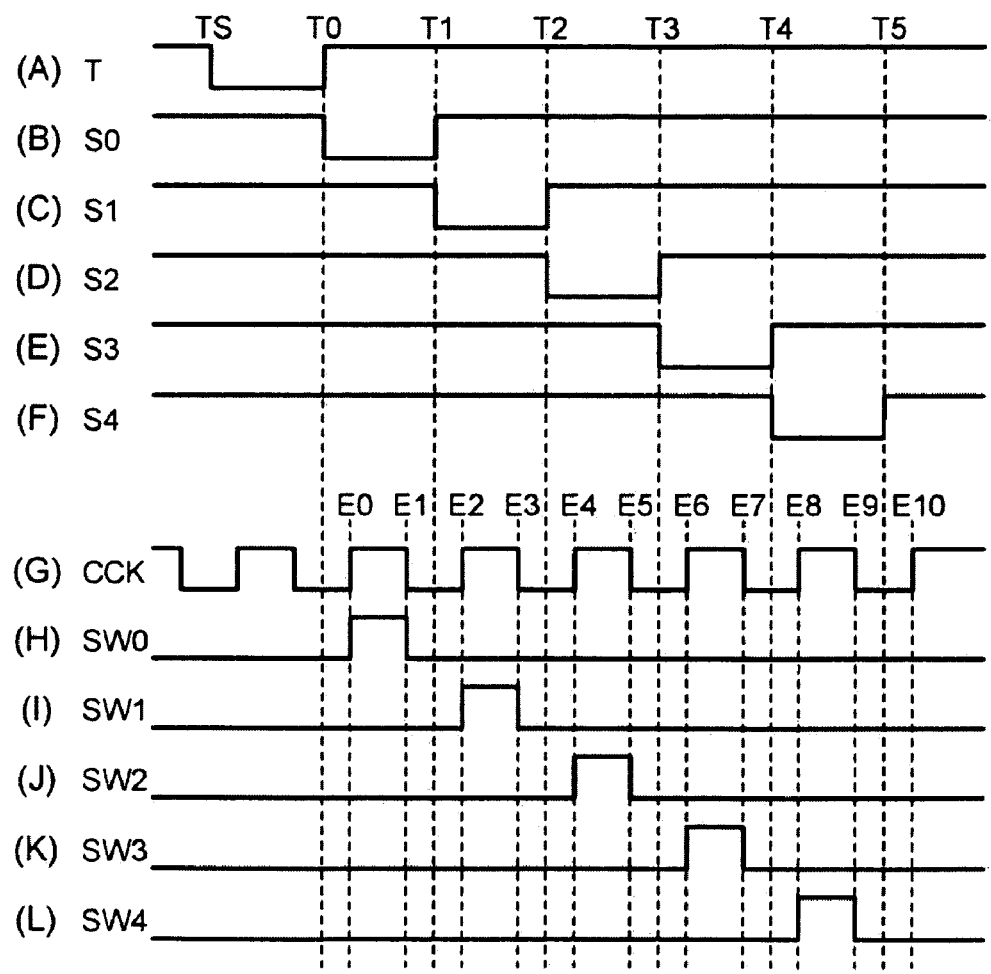
FIG. 6 shows operation timing of major signals in the 1-H delay circuit according to one embodiment of the present invention.

In the shift register 420, a low-level of one-shot pulse of the trigger signal T is input to the first DFF0 during the period of time TS to T0 (see (A) of FIG. 6). A shift clock signal SCK is input to the shift register 420 for each period of time T0 to T1, time T1 to T2, . . . , and time T4 to T5 so that the low-level of the trigger signal T is shifted sequentially toward the following DFF1 to DFF4, with parallel switching signals S0 to S4 as a result of this shifting being extracted from outputs of the DFF0 to DFF4 (see (B) to (F) of FIG. 6). Note that each period of time T0 to T1, time T1 to T2, . . . , and time T4 to T5 is one cycle of the shift clock signal SCK that defines the period of switching cycle of the NMOS transistors N1 to N8. Since the period of switching cycle of the NMOS transistors N1 to N8 is set to 1H period that is delay time of the input signal IN, each period of time T0 to T1, time T1 to T2, . . . , and time T4 to T5 corresponds to the 1H period.

In the on-period control unit 430, a control clock signal CCK in synchronism with the shift clock signal SCK is input to the power-supply side of the inverter elements INV0 to INV4. Note that the control clock signal CCK is of a higher frequency than that of the shift clock signal SCK (a doubled frequency in the example of (A) to (J) of FIG. 6), so that the high-level period (time E0 to E1, time E2 to E3, . . . ) of the control clock signal CCK is set to be shorter than the low-level period (time T0 to T1, time T1 to T2, . . . ) of the parallel switching signals S0 to S4 (see (B) to (G) of FIG. 6). As a result, the inverter elements INV0 to INV4 output parallel switching signals SW0 to SW4 having a high-level period limited to be shorter than the low-level period of the parallel switching signals S0 to S4 (see (H) and (I) of FIG. 6).

In the switched capacitor group 412, it is assumed that input signals IN (color-difference signals R-Y and B-Y) are input to the buffer-type switched capacitor units 410a to 410d. The level of the input signals IN is assumed to vary from D0 in the period of time T0 to T1, to D1 in the period of time T1 to T2, . . . , and to D5 in the period of time T4 to T5 (see (A) of FIG. 7).

First, during the period of time T0 to T1, only the parallel switching signal SW0 of the parallel switching signals SW0 to SW4 input from the on-period control unit 430 has a high-level period (time E0 to E1), with the other parallel switching signals SW1 to SW4 remaining at low (see (H) and (I) of FIG. 6). Thus, in the period of time E0 to E1 among the period of time T0 to T1, the NMOS transistor N1 of the buffer-type switched capacitor unit 410a is turned on, all the remaining NMOS transistors N2 to N8 being turned off (see (B) to (F) of FIG. 7). For this reason, during the period of time E0 to E1, there is formed a charging path of the NMOS transistor N1 and the capacitive element C1 in the buffer-type switched capacitor unit 410a so that the capacitive element C1 is charged with electric charges corresponding to the level D0 of the input signal IN to hold information of the level D0 of the input signal IN on the capacitive element C1 (see (G) of FIG. 7). On the other hand, in the period of time T0 to T1 exclusive of the period of time E0 to E1, esp., the period of time E1 to T1 after charging the capacitive element C1, all the NMOS transistors N1 to N8 are in off-period, imposing reliable restrictions on the charging/discharging operations of all the capacitive elements C1 to C4.

Next during the period of time T1 to T2, only the parallel switching signal SW1 of the parallel switching signals SW0 to SW4 input from the on-period control unit 430 has a high-level period (time E2 to E3), with the other parallel switching signals SW0 and SW2 to SW4 remaining at low (see (H) and (I) of FIG. 6). Thus, in the period of time E2 to E3 among the period of time T1 to T2, the NMOS transistor N2 of the buffer-type switched capacitor unit 410a and the NMOS transistor N3 of the buffer-type switched capacitor unit 410b are turned on, all the remaining NMOS transistors N1 and N4 to N8 being turned off (see (B) to (F) of FIG. 7). For this reason, during the period of time E2 to E3, there is formed a discharging path of the NMOS transistor N2 and the capacitive element C1 in the buffer-type switched capacitor unit 410a so that electric charges held on the capacitive element C1 are discharged, whereupon the level D0 of the input signal IN is read from the capacitive element C1 and is input to the non-inverting input terminal of the voltage follower 411. This results in output of the input signal IN of the level D0 from the voltage follower 411 (see (K) of FIG. 7). During the period of time E2 to E3, there is formed a charging path of the NMOS transistor N3 and the capacitive element C2 in the buffer-type switched capacitor unit 410b so that the capacitive element C2 is charged with electric charges corresponding to the level D1 of the input signal IN to hold information of the level D1 of the input signal IN on the capacitive element C2 (see (H) of FIG. 7). On the other hand, in the period of time T1 to T2 exclusive of the period of time E2 to E3 esp., the period of time T1 to E2 before discharging the capacitive element C1 and before charging the capacitive element C2, all the NMOS transistors N1 to N8 are in off-period, imposing reliable restrictions on the charging/discharging operations of all the capacitive elements C1 to C4.

Afterward, similar operations are performed in the periods of time T2 to T3, time T3 to T4, and time T4 to T5 as well. Thus, at the timing (time T1 to T5) to switch the on/off of the NMOS transistors N1 to N8, there inevitably arise off-periods (time E1 to E2, time E3 to E4, time E5 to E6, time E7 to E8, and time E9 to E10) in which all the NMOS transistors N1 to N8 are turned off. By virtue 6f this, such a phenomenon can surely be prevented that at least two of all the NMOS transistors N1 to N8 are turned on at the same time due to differences in the slew rate or in the threshold value of the NMOS transistors N1 to N8, ensuring execution of proper delay processing free from malfunctions.

OTHER EMBODIMENTS

Although the embodiment of the present invention has hereinabove been described, the above embodiment is intended to facilitate the understanding of the present invention but not to be construed as limiting the present invention. The present invention can variously be changed or modified without departing from its spirit and encompasses equivalents thereof.

Figure 8:
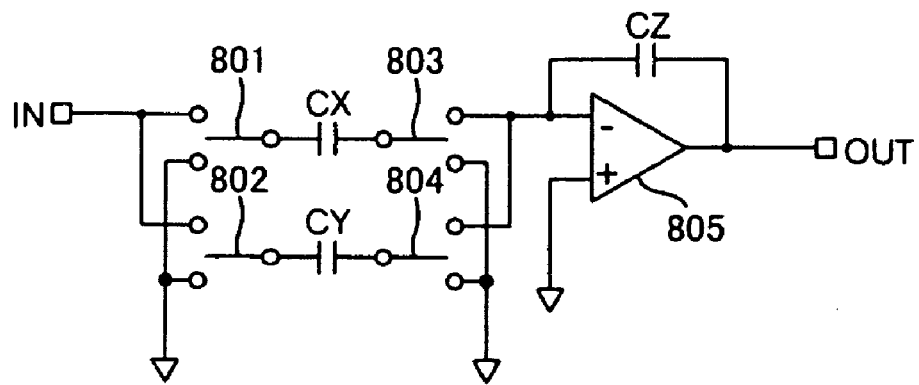
FIG. 8 shows a configuration of a charge-transfer-type switched capacitor unit according to one embodiment of the present invention.

For example, the above embodiment has employed the buffer-type switched capacitor units 410a to 410d in the switched capacitor group 412, but instead may employ so-called charge-transfer-type switched capacitor units as shown in FIG. 8. The charge-transfer-type switched capacitor unit includes a capacitive element CX having switching elements 801 and 803 on both terminals thereof, a capacitive element CY having switching elements 802 and 804 on both terminals thereof, and an operational amplifier 805 having a capacitive element CZ on its negative feedback path, the capacitive elements CX and CY being connected to an inverting input terminal of the operational amplifier 805. The charge-transfer-type switched capacitor unit operates such that for example a pair of the switching elements 801, 804 and a pair of the switching elements 802, 803 repeat on/off in a complementary manner so that the capacitive elements CX and CY alternately perform a charging operation in response to an input signal IN and a discharging operation to the inverting input terminal of the operational amplifier 805.

In the case that the 1H-delay circuit is configured by connecting a multiplicity of such charge-transfer-type switched capacitor units and further by disposing circuits similar to the shift register 420 and the on-period control unit 430, control is performed to turn off all of the switching elements 801 to 804 when on/off of each of the switching elements 801 to 804 is switched to delay the input signal IN. Thus, in the case of using the charge-transfer-type switched capacitor units as well, such a deficiency can surely be avoided that at least two of all the switching elements 801 to 804 are turned on at the same time, ensuring proper delay processing free from any malfunctions.

Figure 9:
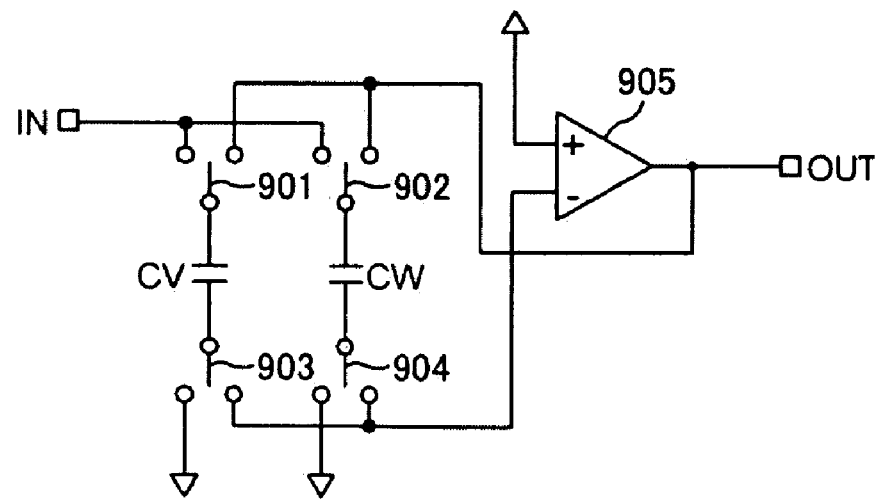
FIG. 9 shows a configuration of a direct-charge-type switched capacitor unit according to one embodiment of the present invention.
Figure 10:
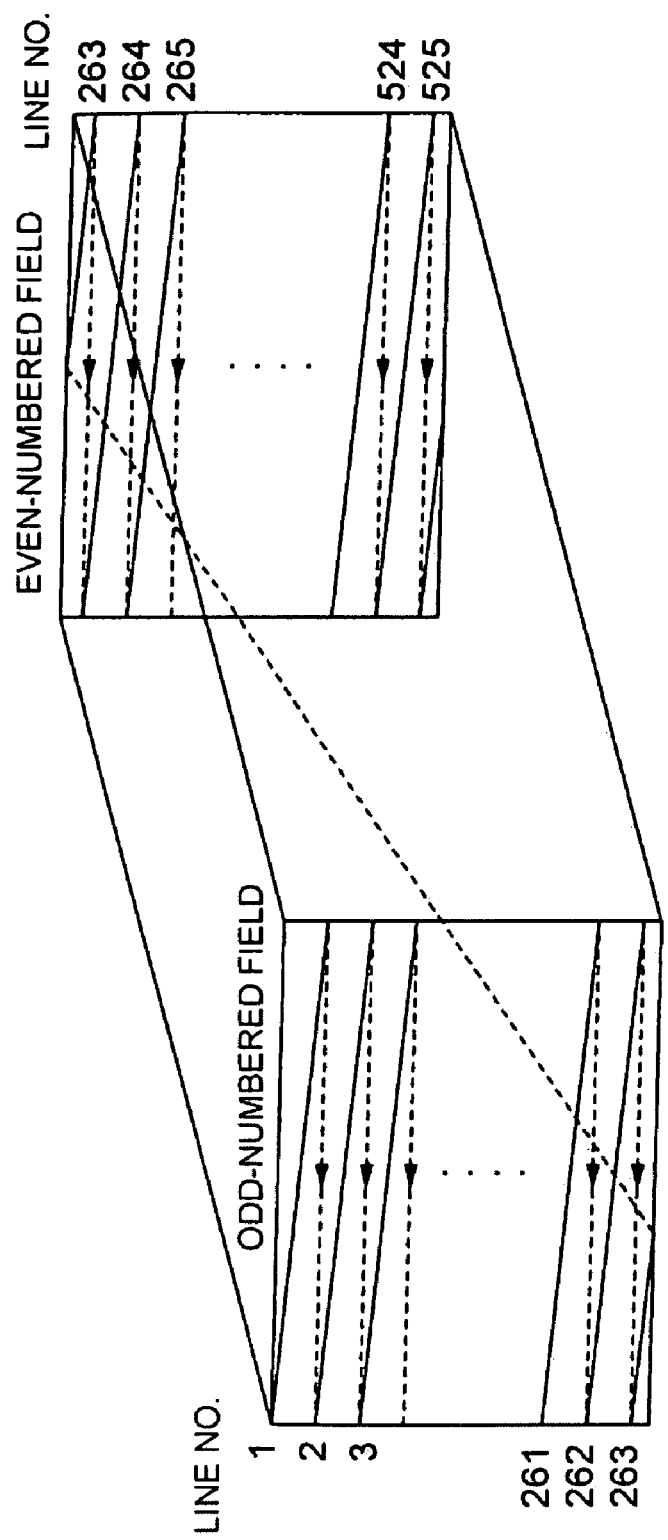
FIG. 10 is an explanatory diagram of interlaced scanning.

For example, the switched capacitor group 412 may employ a so-called direct-charge-type switched capacitor unit as shown in FIG. 9. The direct-charge-type switched capacitor unit includes a capacitive element CV having switching elements 901 and 903 on both terminals thereof, a capacitive element CW having switching elements 902 and 904 on both terminals thereof, and an operation amplifier 905 having a negative feedback path on which the capacitive elements CV and CW are disposed. The direct-charge-type switched capacitor unit operates such that for example a pair of the switching elements 901, 904 and a pair of the switching elements 902, 903 repeat on/off in a complementary manner so that the capacitive elements CV and CW alternately perform a charging operation in response to an input signal IN and a discharging operation to the inverting input terminal of the operational amplifier 905.

In the case that the 1H-delay circuit is configured by connecting a multiplicity of such charge-transfer-type switched capacitor units and further by disposing circuits similar to the shift register 420 and the on-period control unit 430, control is performed to turn off all of the switching elements 901 to 904 when on/off of each of the switching elements 901 to 904 is switched to delay the input signal IN. Thus, in the case of using the direct-charge-type switched capacitor units as well, such a deficiency can surely be avoided that at least two of all the switching elements 901 to 904 are turned on at the same time, ensuring proper delay processing free from any malfunctions.

What is claimed is:

1. A delay circuit acquiring an output signal delayed from an input signal, comprising:
    a switched capacitor group that includes a plurality of switched capacitor units, wherein each of the plurality of switched capacitor units has a switching element, and a capacitive element which is charged/discharged by turning on/off the switching element, and wherein the plurality of switched capacitor units are connected such that the input signal is input in common to all of the plurality of switched capacitor units and such that the capacitive elements are charged as well as such that the capacitive elements are discharged to allow the output signal to be output from each of the plurality of switched capacitor units; and
    a switching control unit that performs on/off control of each of the switching elements of the plurality of switched capacitor units, to cause each of the capacitive elements of the plurality of switched capacitor units to be charged in sequence based on the input signal, and that, upon causing the each of the capacitive elements to be charged in sequence based on the input signal, causes the capacitive element charged last time to be discharged, to allow the output signal to be output in sequence from each of the plurality of switched capacitor units, and that, upon on/off switching of each of the switching elements of the plurality of switched capacitor units, performs control of all of the switching elements of the plurality of switched capacitor units so as to be turned off.

2. The delay circuit of claim 1, wherein the switching control unit sets delay time of the input signal based on a period of switching cycle of the switching element, and upon delaying the input signal, sets an on-period to be shorter than the period of switching cycle, the on-period being a period during which at least one of the switching elements of the plurality of switched capacitor units is turned on.

3. The delay circuit of claim 2, wherein the switching control unit comprises:
    a shift register that shifts serial input signals in sequence every time a shift clock signal with the period of switching cycle being set is input, to output parallel switching signals for turning on/off in sequence the switching elements of the plurality of switched capacitor units; and an on-period control unit that, based on a control signal synchronized with the shift clock signal, when anyone of the parallel switching signals turns to a logical level for turning on at least one of the switching elements of the plurality of switched capacitor units, outputs the parallel switching signals with the period of the logical level being limited to be shorter than the period of switching cycle, to the switching elements of the plurality of switched capacitor units.

4. The delay circuit of claim 1, wherein in the switched capacitor unit, with respect to a couple of the switching elements, one electrode of one switching element and one electrode of the other switching element are connected in common, with a common connection part being connected to one of the capacitive elements, and the input signal is input to the other electrode of the one switching element, and when the one switching element is turned on, the other switching element is turned off so that the one of the capacitive elements is charged based on the input signal, and when the other switching element is turned on, the one switching element is turned off so that the one of the capacitive elements is discharged, to allow the output signal to be output from the other electrode of the other switching element.

5. A video signal processing circuit demodulating a luminance signal and a chroma signal based on a video signal of television broadcasting having three-primary-color information on colors captured as image, further demodulating the chroma signal into two color-difference signals in the course of color demodulating processing of the chroma signal in parallel with luminance signal processing of the luminance signal, and regenerating the three-primary-color information of the video signal of composite form, based on the luminance signal and the two color-difference signals, the video signal processing circuit comprising:

a switched capacitor group that includes a plurality of switched capacitor units, wherein each of the plurality of switched capacitor units has a switching element, and a capacitive element which is charged/discharged by turning on/off the switching element, and wherein the plurality of switched capacitor units are connected such that the demodulated color-difference signal is input in common to all of the plurality of switched capacitor units and such that the capacitive elements are charged as well as such that the capacitive elements are discharged to allow a signal to be output from each of the plurality of switched capacitor units, the signal being delayed from the color-difference signal by 1H period;

a switching control unit that performs on/off control of each of the switching elements of the plurality of switched capacitor units, to cause each of the capacitive elements of the plurality of switched capacitor units to be charged in sequence based on the color-difference signal, and that, upon causing the each of the capacitive elements to be charged in sequence based on the color-difference signal, causes the capacitive element charged last time to be discharged, to allow a signal to be output in sequence from each of the plurality of switched capacitor units, the signal being delayed from the color-difference signal by 1H period, and that, upon on/off switching of each of the switching elements of the plurality of switched capacitor units, performs control of all of the switching elements of the plurality of switched capacitor units so as to be turned off;

an adder that adds together the color-difference signals before and after the 1H-period delay; and a matrix circuit that regenerates the three-primary-color information based on the result of adding performed by the adder and on the luminance signal subjected to the luminance signal processing.

6. The video signal processing circuit of claim 5, wherein the switching control unit sets delay time of the color-difference signal based on a period of switching cycle of the switching element, and upon delaying the color-difference signal, sets an on-period to be shorter than the period of switching cycle, the on-period being a period during which at least one of the switching elements of the plurality of switched capacitor units is turned on.

7. The video signal processing circuit of claim 6, wherein the switching control unit comprises:

a shift register that shifts serial input signals in sequence every time a shift clock signal with the period of switching cycle being set is input, to output parallel switching signals for turning on/off in sequence the switching elements of the plurality of switched capacitor units; and an on-period control unit that, based on a control signal synchronized with the shift clock signal, when anyone of the parallel switching signals turns to a logical level for turning on at least one of the switching elements of the plurality of switched capacitor units, outputs the parallel switching signals with the period of the logical level being limited to be shorter than the period of switching cycle, to the switching elements of the plurality of switched capacitor units.

8. The video signal processing circuit of claim 5, wherein in the switched capacitor unit, with respect to a couple of the switching elements, one electrode of one switching element and one electrode of the other switching element are connected in common, with a common connection part being connected to one of the capacitive elements, and the color-difference signal is input to the other electrode of the one switching element, and when the one switching element is turned on, the other switching element is turned off so that the one of the capacitive elements is charged based on the color-difference signal, and when the other switching element is turned on, the one switching element is turned off so that the one of the capacitive elements is discharged, to allow a signal to be output from the other electrode of the other switching element, the signal being delayed from the color-difference signal by 1H period.

9. The video signal processing circuit of claim 5, wherein the video signal is a signal conforming to PAL (Phase Alternation by Line) system or SECAM (SEquential Couleur A Memoire) system.

10. The video signal processing circuit of claim 5, wherein the video signal processing circuit is a circuit formed by BiCMOS process.

* * * * *